US009936289B2

(12) United States Patent
Oliaei

(10) Patent No.: US 9,936,289 B2
(45) Date of Patent: Apr. 3, 2018

(54) MICROELECTROMECHANICAL SYSTEMS (MEMS) MICROPHONE ARRAY WITH DEDICATED AMPLIFIERS

(71) Applicant: INVENSENSE, INC., San Jose, CA (US)

(72) Inventor: Omid Oliaei, Sunnyvale, CA (US)

(73) Assignee: INVENSENSE, INC., San Jose, CA (US)

( * ) Notice: Subject to any disclaimer, the term of this patent is extended or adjusted under 35 U.S.C. 154(b) by 28 days.

(21) Appl. No.: 14/553,296

(22) Filed: Nov. 25, 2014

(65) Prior Publication Data

US 2016/0150325 A1    May 26, 2016

(51) Int. Cl.
| | | |
|---|---|---|
| *H04R 3/00* | (2006.01) | |
| *H03G 5/00* | (2006.01) | |
| *H04R 1/40* | (2006.01) | |
| *H03F 3/183* | (2006.01) | |
| *H04R 29/00* | (2006.01) | |

(52) U.S. Cl.
CPC .............. *H04R 1/406* (2013.01); *H03F 3/183* (2013.01); *H04R 3/005* (2013.01); *H04R 29/005* (2013.01); *H03F 2200/03* (2013.01); *H04R 2201/003* (2013.01); *H04R 2499/11* (2013.01); *H04R 2499/15* (2013.01)

(58) Field of Classification Search
CPC ...... H04R 3/00; H04R 2201/003; H04R 1/08; B81B 7/008; B81B 2207/015
USPC ... 381/111, 114, 359, 92, 122, 98, 309, 361, 381/102
See application file for complete search history.

(56) References Cited

U.S. PATENT DOCUMENTS

| | | | | |
|---|---|---|---|---|
| 6,857,312 B2* | 2/2005 | Choe | ...................... | H04R 23/00 73/170.11 |
| 2009/0052701 A1* | 2/2009 | Reams | .................... | H04S 1/005 381/309 |
| 2013/0034257 A1* | 2/2013 | Doller | .................. | H04R 19/005 381/361 |
| 2013/0108074 A1* | 5/2013 | Reining | ................. | H04R 3/005 381/92 |
| 2015/0146885 A1* | 5/2015 | Fitzgerald | .............. | H04R 3/005 381/98 |
| 2015/0362362 A1* | 12/2015 | Pan | ........................ | G01H 11/06 73/645 |

\* cited by examiner

*Primary Examiner* — Thjuan K Addy
(74) *Attorney, Agent, or Firm* — Amin, Turocy & Watson, LLP

(57) ABSTRACT

Microelectromechanical systems (MEMS) acoustic sensors are implemented with dedicated preamplifiers. Provided implementations can comprise an array of MEMS acoustic sensor elements each having a dedicated preamplifier. A summation node can add outputs of each preamplifier and an analog to digital converter (ADC) can receive the summed outputs. Other implementations can comprise an array of MEMS acoustic sensors each having dedicated preamplifiers. Some of the preamplifiers receive an invert signal and an ADC can subtract inverted signals from non-inverted signals.

19 Claims, 11 Drawing Sheets

MICROELECTROMECHANICAL SYSTEMS
(MEMS) MICROPHONE ARRAY WITH
DEDICATED AMPLIFIERS

TECHNICAL FIELD

The subject disclosure relates to microelectromechanical systems (MEMS), more particularly, MEMS microphone arrays with dedicated amplifiers.

BACKGROUND

Integration of component devices of a consumer electronics product is desirable to reduce form factor. Integration often results in size reduction because multiple devices become part of one integrated system. The integrated system itself can then be progressively reduced in size over time. Integration of multiple devices into one system is complex and made more complex in cases where each device is of a different type and has different manufacturing requirements.

For example, microelectromechanical systems (MEMS) acoustic sensors (e.g. MEMS microphones) are utilized in applications having size and power constraints, such as in mobile devices. Presently, MEMS microphones suffer from a number of drawbacks such as noise, interference and non-linearity. Noise can result from the various components forming the microphone such as amplifiers (e.g., preamplifiers), analog to digital converters (ADC), and the power supply. External low-frequency or high-frequency sources may cause interference. MEMS microphones are particularly vulnerable to RF interference. Non-linearity of the membrane and the electronic circuit that processes the signal generated by the MEMS can distort the acoustic signal and thus, degrade the performance of the system. In conventional systems, a single amplifier is used to amplify the electrical signal generated by the membrane or electroacoustic transducer. MEMS microphones may use more than one membrane for transduction to achieve a higher signal-to-noise ratio. Such systems traditionally rely on a single amplifier to amplify the input received from one or more acoustic membranes.

However, such systems provide no immunity against external interference, supply noise and non-linearity. In particular, non-linearity severely limits the maximum signal that the system can handle with high fidelity.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, a system comprises a plurality of microelectromechanical systems (MEMS) acoustic sensors with dedicated preamplifiers. Each acoustic sensor or membrane is associated with a separate preamplifier. Signals from the preamplifiers can be summed by a summation node. The summed signals can then be received by an analog to digital converter (ADC).

In another non-limiting example, a system can comprise an array of MEMS acoustic sensors, each MEMS acoustic sensor comprising a sensing membrane. The system further comprises an array of preamplifiers, each preamplifier respectively coupled to a sensing membrane of the array of MEMS acoustic sensors, each preamplifier generating a respective output. In another aspect, the system comprises an ADC coupled to the array of preamplifiers and configured for generating an output based on the respective outputs of the preamplifiers.

In another example, the system can comprise a plurality of MEMS acoustic sensors with dedicated preamplifiers that can receive differential signals. One or more of the dedicated preamplifiers can invert the differential signal. Output of the preamplifiers that do not invert the signals can be summed and output of the preamplifiers that do invert the signals can be separately summed from the non-inverted signals. An ADC can receive the summed signals and subtract a signal associated with inversion from a signal not associated with inversion.

Moreover, an exemplary method for pre-amplifying signals associated with MEMS acoustic sensors is described. The method can comprise providing a plurality of MEMS acoustic sensors, each configured to receive an acoustic signal. Signals output from each MEMS acoustic sensor can be received by dedicated preamplifiers. The preamplifiers can amplify the signals prior to reception by an ADC. The amplified signals may be summed by a summation node prior to reception by the ADC. In a differential configuration, the ADC can receive the amplified signals and can subtract one of the signals from another signal.

The following description and the drawings contain certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Overview

Figure 1:
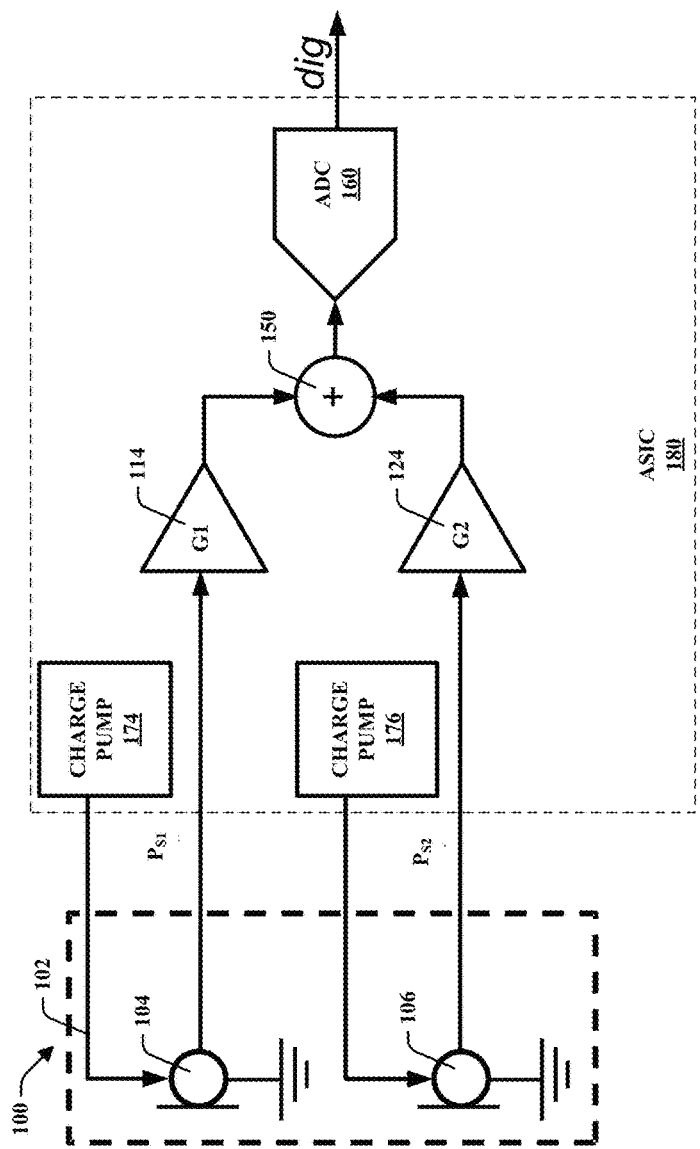
FIG. 1 depicts a non-limiting schematic diagram of an exemplary microelectromechanical systems (MEMS) acoustic sensor system comprising dedicated preamplifiers, according to various non-limiting aspects of the subject disclosure.

While a brief overview is provided, certain aspects of the subject disclosure are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques and methods of the subject disclosure are described in the context of MEMS acoustic sensors. However, as further detailed below, various exemplary implementations can be applied to other areas of MEMS sensor design and packaging, without departing from the subject matter described herein.

As used herein, the terms MEMS microphone(s), MEMS acoustic sensor(s), MEMS audio sensor(s), and the like are used interchangeably unless context warrants a particular distinction among such terms. For instance, the terms can refer to MEMS devices or components that can measure a proximity, determine acoustic characteristics, generate acoustic signals, or the like.

Additionally, terms such as "at the same time," "common time," "simultaneous," "simultaneously," "concurrently," "substantially simultaneously," "immediate," and the like are employed interchangeably throughout, unless context warrants particular distinctions among the terms. It should be appreciated that such terms can refer to times relative to each other and may not refer to an exactly simultaneously action(s). For example, system limitations (e.g., download speed, processor speed, memory access speed, etc.) can account for delays or unsynchronized actions. In other embodiments, such terms can refer to acts or actions occurring within a period that does not exceed a defined threshold amount of time.

Aspects of systems, apparatuses or processes explained in this disclosure can constitute machine-executable components embodied within machine(s), hardware components, or hardware components in combination with machine executable components, e.g., embodied in one or more computer readable mediums (or media) associated with one or more machines. Such components, when executed by the one or more machines, e.g., computer(s), computing device(s), virtual machine(s), etc., can cause the machine(s) to perform the operations described. While the various components are illustrated as separate components, it is noted that the various components can be comprised of one or more other components. Further, it is noted that the embodiments can comprise additional components not shown for sake of brevity. Additionally, various aspects described herein may be performed by one device or two or more devices in communication with each other.

To that end, the one or more processors can execute code instructions stored in memory, for example, volatile memory and/or nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory (e.g., data stores, databases) of the subject systems and methods is intended to comprise, without being limited to, these and any other suitable types of memory.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

Figure 11:
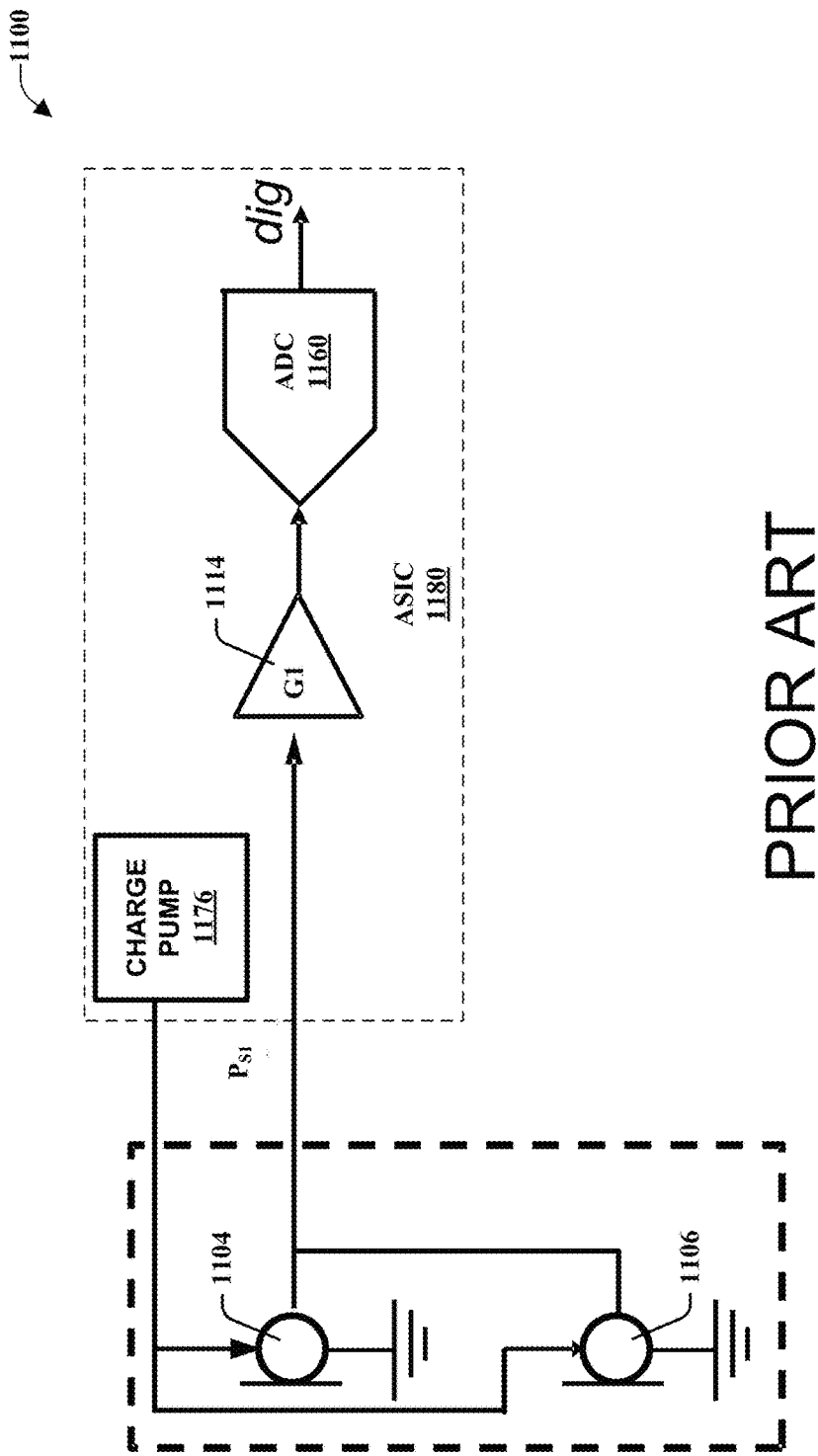
FIG. 11 depicts an example prior art MEMS acoustic sensor system.

A MEMS microphone may use more than one membrane in order to achieve a higher signal-to-noise ratio. Traditional MEMS microphones use a single amplifier independent of the number of membranes. For example, FIG. 11 depicts a prior art MEMS microphone system 1100 that includes a charge pump 1176 coupled to acoustic sensors 1104 and 1106. Both acoustic sensors 1104 and 1106 are coupled to an ASIC that has a single amplifier 1114 feeding an ADC 1160. In other words, such systems do not take advantage of the diversity of the signal sources provided in a multi-membrane design to overcome some intrinsic limitations of a single-amplifier design. Such limitations include distortion due to the non-linear characteristics of the membrane and the signal processing, sensitivity to supply noise and RF interference.

The systems and methods of the present invention can process an output signal of each membrane separately and combine the resulting signals in order to reduce the effect of impairments such as noise, interference and non-linearity. It is noted that systems and methods of the present invention may be utilized in differential MEMS microphone configurations. The systems and methods of the present invention can enable the unique capability of fabricating and integrating a MEMS structure, including multiple membranes, identical or different, each providing a separate output signal independent from the other membrane outputs. Another aspect is the capability of generating and applying a different DC bias voltage to each membrane.

To these and/or related ends, various aspects of MEMS acoustic sensors with dedicated preamplifiers are described herein. For instance, exemplary implementations can provide an array of MEMS acoustic sensors comprising sensing membranes. The sensing membranes (or membranes) are respectively coupled to dedicated preamplifiers. Preamplifiers can refer to amplifiers that receive a signal before an ADC receives the signal. In another aspect, "dedicated" refers to a relationship wherein different preamplifiers are coupled to different membranes. That is a first membrane is associated with a first preamplifier and a second membrane is associated with a second preamplifier.

In some embodiments, a summation node can receive output of the dedicated preamplifiers and can sum the outputs. The summed output can be received by an ADC. In other embodiments, one or more summation nodes can each receive output of one or more dedicated preamplifiers. For instance, a system can comprise four MEMS acoustic sensors and four dedicated preamplifiers. A first and second preamplifier can be associated with non-inverted signals while a third and fourth preamplifier can be associated with inverted signals. A first summation node receives the non-inverted signals and a second summation node can receive the inverted signals. In another aspect, an ADC can receive the summed signals and can subtract one of the summed signals from the other.

Various other configurations or arrangements are described herein. It is noted that the various embodiments can include other components and/or functionality. It is further noted that the various embodiments can be included in larger systems, including, smart televisions, smart phones or other cellular phones, wearables (e.g., watches, headphones, etc.), tablet computers, electronic reader devices (i.e., e-readers), laptop computers, desktop computers, monitors, digital recording devices, appliances, home electronics, handheld gaming devices, remote controllers (e.g., video game controllers, television controllers, etc.), automotive devices, personal electronic equipment, medical devices, industrial systems, cameras, and various other devices or fields.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

Accordingly, FIG. 1 depicts a non-limiting schematic diagram of a system 100 comprising dedicated preamplifiers, according to various non-limiting aspects of the subject disclosure. It is to be appreciated that system 100 can be used in connection with implementing one or more systems or components shown and described with reference to other figures disclosed herein. Further, it is noted that the embodiments can comprise additional components not shown for sake of brevity. Additionally, various aspects described herein may be performed by one device or two or more devices in communication with each other.

System 100 can primarily include sensor array 102 (which can comprise MEMS acoustic sensors 104 and 106), application specific integrated circuit (ASIC) 180 (which can comprise dedicated preamplifiers 114 and 124, and ADC 160), summation node 150, charge pumps 174 and 176. It is appreciated that system 100 can include other components or circuitry not shown for readability, such as support circuitry (e.g., bandgap components, power-on-reset components, timing control components, etc). It is further appreciated that system 100 can be used in connection with implementing one or more of the systems or components shown and described in connection with other figures disclosed herein. It is noted that MEMS acoustic sensors 104 and 106 can comprise one or more sensing elements. Such sensing elements can include membranes, diaphragms, or other elements capable of sensing and/or generating pulse signals. For instance, membranes of MEMS acoustic sensor 104 and/or 106 can be excited while receiving an acoustic signal. In an aspect, each membrane may have a dedicated charge pump or can share a same charge pump. It is noted that the received acoustic signals can induce movement of the membranes, which in turn transform these movements into an electrical signal based on a DC bias provided by charge pumps. It is further noted that various combinations of different types of MEMS acoustic sensors. For example, the various acoustic sensors of system 100 can be of different designs and/or sensitivities. Furthermore, each sensing element of acoustic sensors 104 and 106 may have different designs or characteristics. For example, one sensor may have smaller area, or higher stiffness than the one. Such sensing elements may be embodied within or coupled to hardware, such as a single integrated circuit (IC) chip, multiple ICs, an ASIC, or the like. In an aspect, an ASIC can include or can be coupled to a processor or other device. Moreover, system 100 can comprise other components or devices that are capable of generating a signal. For example, system 100 may comprise a different number of acoustic sensors, ASICs, processors, and the like.

Sensor array 102 can comprise MEMS acoustic sensors 104 and 106. Each of MEMS acoustic sensors 104 and 106 can comprise sensing acoustic signals. For example, a cellular phone can comprise MEMS acoustic sensors 104 and 106. When a user speaks into the cellular phone, MEMS acoustic sensors 104 and 106 can detect acoustic signals associated with the speech. It is noted that MEMS acoustic sensors 104 and 106 can be configured (selectively and/or programmably) for various applications and/or functions, such as proximity detection, speech detection, pressure detection, and/or the like.

MEMS acoustic sensors 104 and 106 can be connected (e.g., removably or otherwise) to ASIC 180. For instance, MEMS acoustic sensors 104 can be wirebonded to preamplifier 114 and/or ASIC 180. Likewise, MEMS acoustic sensors 106 can be wiredbonded to preamplifier 124 and/or ASIC 180. In at least one embodiment, MEMS acoustic sensors 104 and/or MEMS acoustic sensors 116 can be bonded and attached to the ASIC. It is noted that bonding can include chemical, mechanical, or other methods of bonding components. For example, various embodiments can utilize eutectic bonds (AlGe, CuSn, AuSi, etc.), fusion bonds, compression, thermocompression, adhesive bonds (e.g., glue), solder, anodic bonding, glass frit, and the like.

Preamplifiers 114 and 124 can amplify signals, such as signals received from MEMS acoustic sensors 104 and 106. As used herein, reference to a preamplifier(s), a amplifier(s), or the like, refers to a device that increases the power of a signal, such as transistors or other devices. Generally, a preamplifier uses energy from a power supply and controls an output to match an input signal shape but with a larger amplitude. In this sense, an amplifier modulates the output of the power supply to make the output signal stronger than the input signal. Preamplifiers 114 and 124 can comprise various different types of amplifiers depending on desired applications. For instance, Preamplifiers 114 and 124 can comprise voltage amplifiers, current amplifiers, transconductance amplifiers, and/or transresistance amplifier. A voltage amplifier receives an input voltage and amplifies the input to a larger output voltage. Current amplifiers alter an input current to a larger output current. Transconductance amplifiers respond to a change in input voltage by delivering a related change in output current. Further, transresistance amplifiers respond to a changing input current by delivering a related changing output voltage. It is noted that other naming conventions and/or classification can be utilized. It is further noted that system 100 can utilize other types of amplifiers. Each preamplifier may have a different gain, noise or linearity characteristics. In one aspect, the combination of acoustic sensor 104 and preamplifier 114 may have a total gain identical to the combination of acoustic sensor 106 and preamplifier 124. In another aspect, the combination of acoustic sensor 104 and preamplifier 114 may have a total gain different than the combination of acoustic sensor 106 and preamplifier 124. The DC bias of each acoustic sensor 104 and 106, the mechanical design of each acoustic sensor 104 and 106 and the characteristics of each preamplifier 114 and 124, such as noise, linearity, current consumption, are selected so as to achieve a certain signal-to-noise ratio, linearity or maximum sound pressure level for the overall system.

In embodiments, summation node 150 can comprise components configured for adding signals received from preamplifiers 114 and 124. As described above, preamplifiers 114 and 124 can comprise various types of amplifiers. In embodiments, summation node 150 can comprise one or more amplifiers of an appropriate type given a chosen type for preamplifiers 114 and 124. In some embodiments, summation node 150 can utilize current amplifiers or transconductance (or transconductor) amplifiers to reduce large signal swings. In some embodiments, acoustic sensor 106 may have a substantially lower sensitivity than acoustic sensor 104, which allows acoustic sensor 106 to receive a larger acoustic signal. Accordingly, preamplifier 124 may have a substantially larger gain than preamplifier 114 to compensate for sensitivity difference between acoustic sensor 104 and acoustic sensor 106. In some embodiments, preamplifiers 114 and 124 may have a variable gain set, an automatic gain control (AGC) system, or a processor, for example, to increase the dynamic range of the MEMS microphone. The gain of each preamplifier 114 and 124 may be changed dependently, independently, synchronously, asynchronously, continuously or in discrete steps according to a certain AGC algorithm. Various AGC algorithms of embodiments disclosed herein can utilize average or peak output signal levels to adjust the gain to a desired level, such as a predetermined or dynamically determined target level. For example, AGC algorithms or processes can reduce or raise gains associated with one or more of the preamplifiers based on a signal strength or a level of noise. As such, the overall system can maximize linearity of the MEMS microphone, or increase the maximum sound pressure level without significant distortion, while achieving high signal-to-noise ratio when the input acoustic signal is weak, for example below 100 dBSPL.

ADC 160 can receive a signal from summation node 150 and convert the signal to a digital signal. In an aspect, ADC 160 device converts the signal (e.g., voltage or current) to a digital number that represents the signal's amplitude. In another aspect, ADC 160 conversion involves sampling and quantization of the signal. In embodiments, the dynamic range of ADC 160 can be influenced by many factors, including the resolution, linearity and accuracy, and jitter. ADC 160 can be chosen to match a bandwidth and required SNR of the signal to be quantized. ADC 160 may provide an isolated measurement that converts an input analog voltage or current to a digital number proportional to the magnitude of the voltage or current. It is noted that ADC 160 can be coupled to (e.g., electronically and/or physically) larger systems and/or various components, such as a computer processor. In an example, a processor can determine characteristics of acoustic signals based on output of ADC 160.

Figure 2:
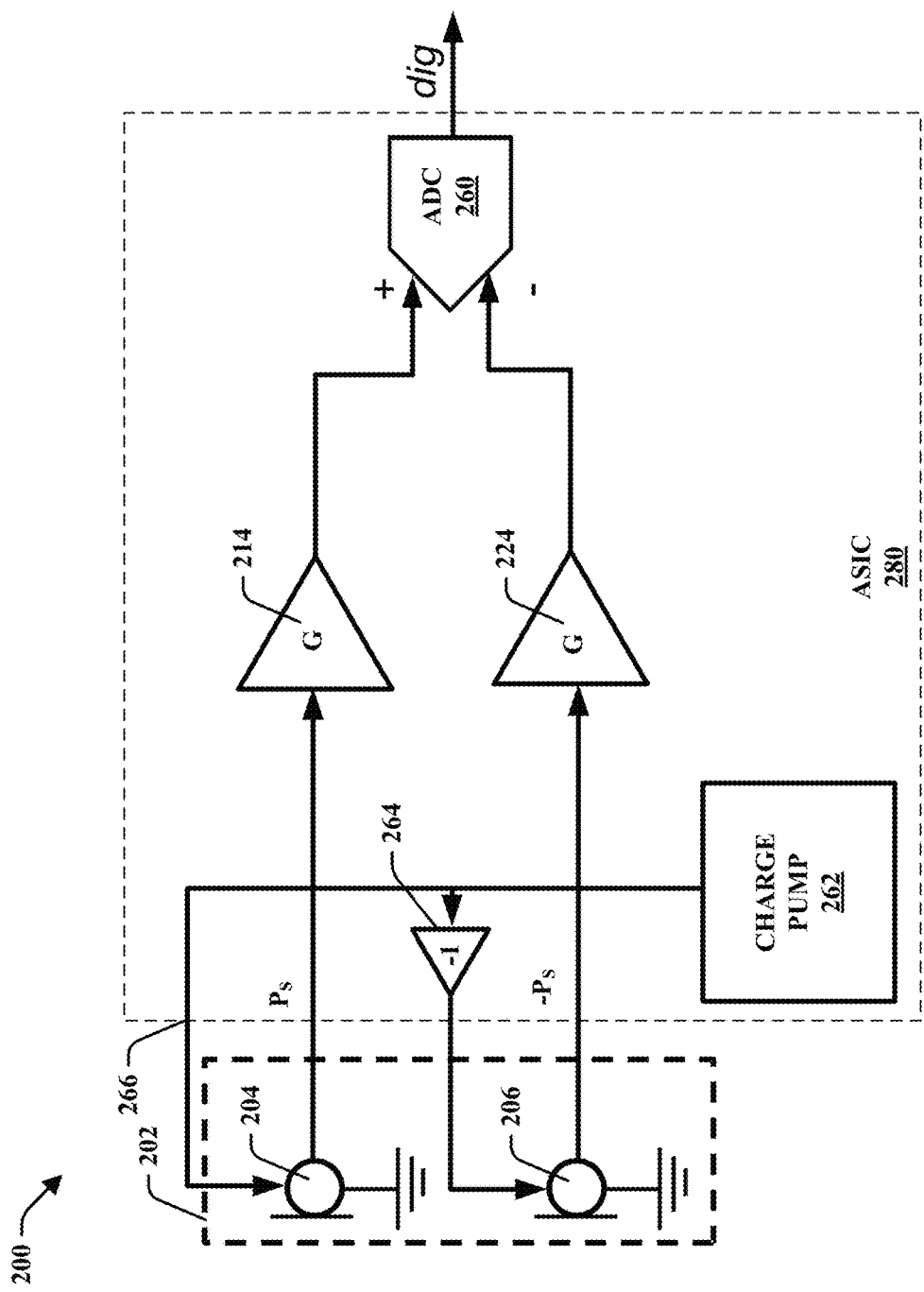
FIG. 2 depicts a non-limiting schematic diagram of an exemplary MEMS acoustic sensor system in a differential configuration and comprising dedicated preamplifiers, according to various non-limiting aspects of the subject disclosure.

Turning to FIG. 2, there depicted is non-limiting schematic diagram of a system 200 comprising dedicated preamplifiers and a charge pump, according to various non-limiting aspects of the subject disclosure. For instance, system 200 can facilitate sensing via differential MEMS acoustic sensors. While system 200 is depicted with two acoustic sensors (e.g., MEMS microphones), it is noted that system 200 can comprise other acoustic sensors not shown for brevity. System 200 can be comprised within various types of devices in accordance with embodiments disclosed herein, such as, smart phones, tablet computers, e-readers, monitors, televisions, remote controls, set top boxes, control panels (e.g., automotive control panels, etc.), desktop computers, laptop computers, and the like. Moreover, like named components associated with the various figures described herein can perform similar or identical functions and/or comprise similar or identical circuitry, logic, unless context warrants a particular distinction among such components.

As depicted, system 200 can primarily comprise sensor array 202 (which can comprise MEMS acoustic sensors 204 and 206), ASIC 180 (which can comprise dedicated preamplifiers 214 and 224, and ADC 260), charge pump 262, feed line 266 and inverter 264. It is to be appreciated that system 200 can be used in connection with implementing one or more of the systems or components shown and described in connection with other figures disclosed herein. It is noted that MEMS acoustic sensors 204 and 206 can comprise one or more sensing elements. Such sensing elements can include membranes, diaphragms, or other elements capable of sensing and/or generating pulse signals.

In an embodiment, MEMS acoustic sensors 204 and 206 can be arranged to facilitate a differential sensing scheme. For instance, a structure can comprise a first surface and a second surface attached to a first substrate. A first electrode is formed on the first substrate and a second electrode is formed by a conductive layer on a second substrate. The structure is suspended between first and second electrodes to provide a differential sensing scheme. The structure is displaced in the presence of an acoustic pressure differential between the first and second surfaces of the first plate. For example, a MEMS microphone structure can be suspended between the first and second electrodes to provide a differential sensing scheme. Moreover, one of the first electrode and second electrode is a deposited conductor on the substrate and the other of the first electrode and second electrode is a conductive back plate. Only one of the first or second substrates contains an opening to expose the structure to the environment. In embodiments, the differential scheme allows for two variable capacitances to be set across a membrane as the gaps between a microphone plate and two sense electrodes. The gaps and consequentially the capacitances change with acoustic excitation. The corresponding capacitance changes are opposite and are the basis of the differential sensing scheme. In another aspect, as depicted, charge pump 262 can generate a positive voltage ($P_S$) and inverter 264 inverts the voltage to generate a negative voltage ($-P_S$). MEMS acoustic sensors 204 and 206 can be coupled to charge pump (e.g., a voltage source) and/or differential amplifiers.

It is noted that system 200 can comprise a different number of charge pumps, such as charge pump 262 and a second charge pump (not shown for readability). For example, charge pump 262 can be coupled to MEMS acoustic sensor 204 and can generate a positive voltage, whereas the second charge pump can be coupled to MEMS acoustic sensor 206 and can generate a negative voltage. In this configuration, system 200 does not comprise inverter 264.

In another aspect, a signal coming from MEMS acoustic sensor 204 can be out of phase with the signal coming from MEMS acoustic sensor 206. Thus, in contrast with system 100, system 200 does not include a summation node. Rather, ADC 260 can subtract the signals (e.g., subtract the signal coming from MEMS acoustic sensor 204 can be out of phase with the signal coming from MEMS acoustic sensor 206) and can convert the subtracted signals to a digital signal. It is appreciated that other configurations can be utilized, such as components that invert a signal again and a summation node that adds the signals.

According to various aspects disclosed herein, noise can be induced by components of system 200 and/or other components not shown for readability. Furthermore, noise or interference can be induced by components outside of system 200. Supply noise and RF interference are of particular concern in systems comprising MEMS microphones. It is appreciated that a differential system can provide improved immunity to noise and interference. In addition, a differential or pseudo-differential sensor-preamplifier combination comprising acoustic sensor 204, preamplifier 214, acoustic sensor 206 and preamplifier 224 facilitates interface with the differential ADC 260. It is further appreciated that a single-ended amplifier would require an inverter or a dummy preamplifier to interface with a differential ADC. The extra inverter or dummy preamplifier would have the drawback of introducing additional noise and increasing power consumption. Furthermore, such structure would not provide immunity to supply noise or RF interference for the non-differential components.

Figure 3:
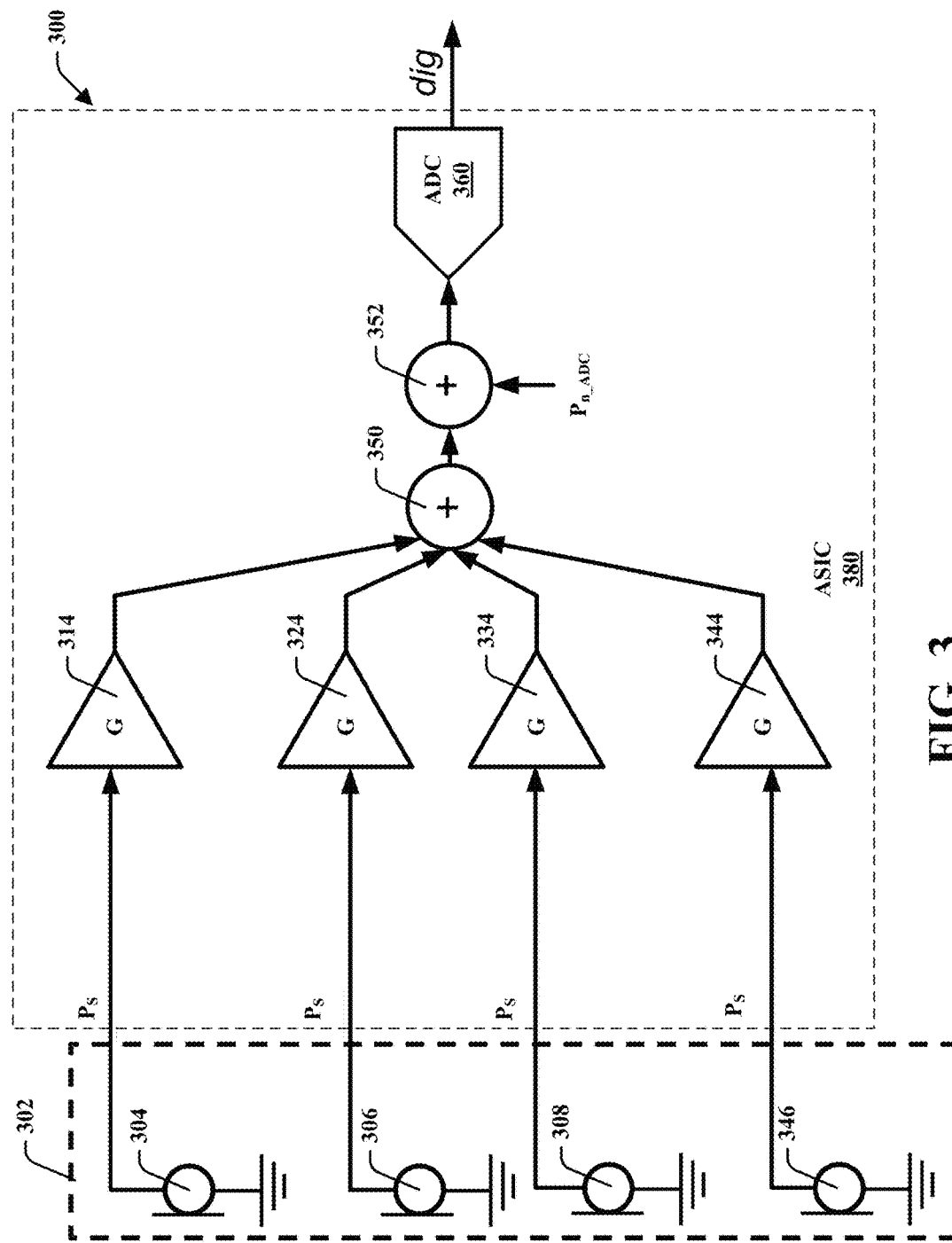
FIG. 3 depicts a non-limiting schematic diagram of an exemplary MEMS acoustic sensor system comprising four dedicated preamplifiers, according to various non-limiting aspects of the subject disclosure.

Turning now to FIG. 3, there depicted is a non-limiting schematic diagram of a system 300 comprising four dedicated preamplifiers, according to various non-limiting aspects of the subject disclosure. It is to be appreciated that system 300 can be used in connection with implementing one or more systems or components shown and described with reference to other figures disclosed herein. Further, it is noted that the embodiments can comprise additional components not shown for sake of brevity. Additionally, various aspects described herein may be performed by one device or two or more devices in communication with each other.

System 300 can primarily include sensor array 302 (which can comprise MEMS acoustic sensors 304, 306, 308 and 346), and ASIC 380 (which can comprise dedicated preamplifiers 314, 324, 334 and 344, summation node 350 and ADC 360). It is noted that MEMS acoustic sensors 304, 306, 308 and 346 can comprise one or more sensing elements. Such sensing elements can include membranes, diaphragms, or other elements capable of sensing and/or generating pulse signals. Furthermore, such sensing elements may be embodied within or coupled to hardware, such as a single IC chip, multiple ICs, an ASIC, or the like. It is noted that, system 400 may comprise a different number of acoustic sensors, preamplifiers, ASICs, processors, and the like.

As described above, one or more of acoustic sensors 304, 306, 308 and 346 may have its own charge pump or share charge pumps with some other sensors. Furthermore, one or more of acoustic sensors 304, 306, 308 and 346 may have a different mechanical design, sensitivity and characteristics. Accordingly, each preamplifier may have a different gain, different noise performance, different bias current and different non-linear characteristic.

Figure 4:
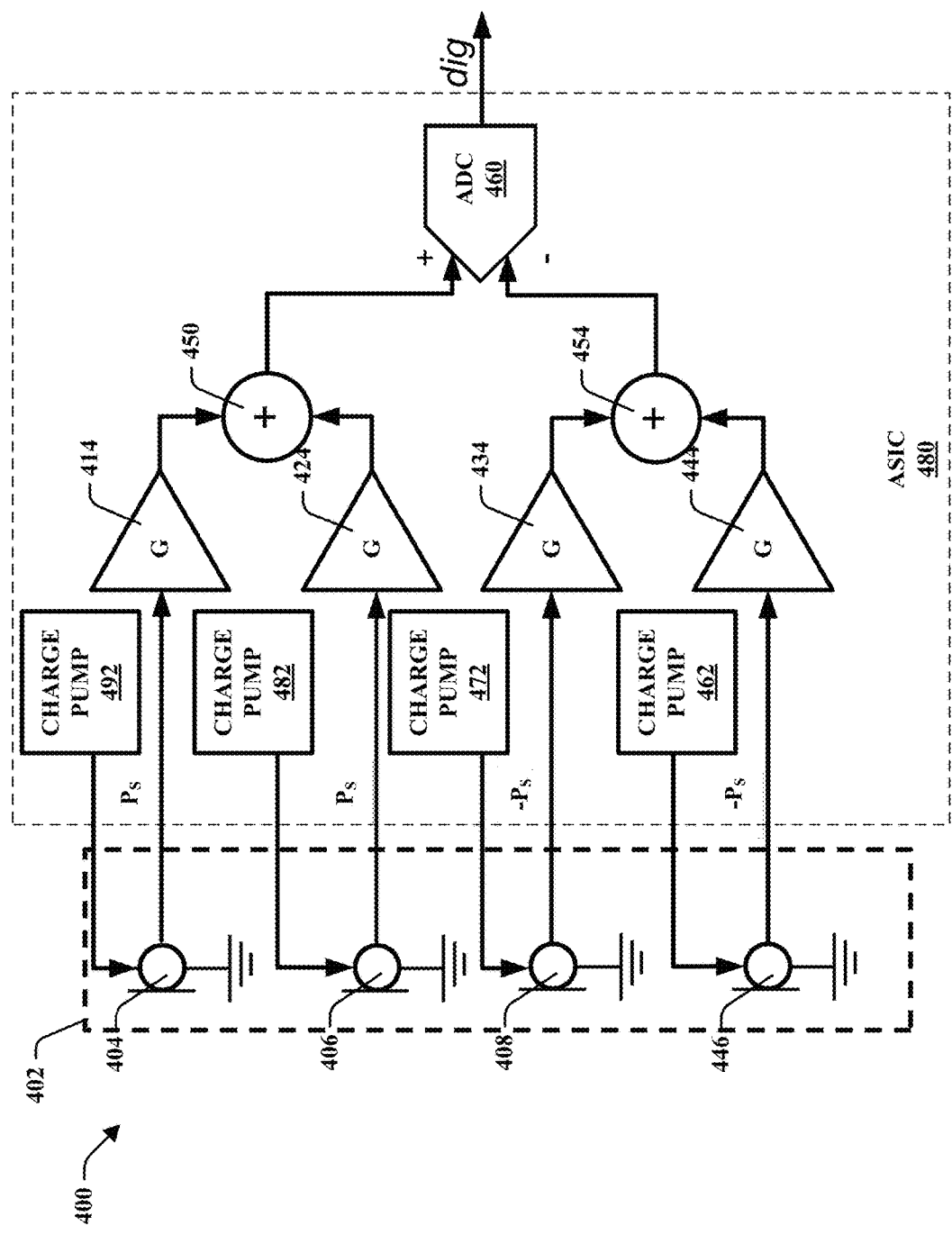
FIG. 4 depicts a non-limiting schematic diagram of an exemplary MEMS acoustic sensor system comprising four dedicated preamplifiers and four charge pumps, according to various non-limiting aspects of the subject disclosure.

Turning to FIG. 4, there depicted is non-limiting schematic diagram of a system 500 comprising dedicated preamplifiers and a charge pump, according to various non-limiting aspects of the subject disclosure. For instance, system 400 can facilitate sensing via differential MEMS acoustic sensors. While system 400 is depicted with four acoustic sensors (e.g., MEMS microphones), it is noted that system 400 can comprise other acoustic sensors not shown for brevity. System 400 can be comprised within various types of devices in accordance with embodiments disclosed herein, such as, smart phones, tablet computers, e-readers, monitors, televisions, remote controls, set top boxes, control panels (e.g., automotive control panels, etc.), desktop computers, laptop computers, and the like. Moreover, like named components associated with the various figures described herein can perform similar or identical functions and/or comprise similar or identical circuitry, logic, unless context warrants a particular distinction among such components.

As depicted, system 400 can primarily comprise array 402 (which can comprise MEMS acoustic sensors 404, 406, 408 and 446), and ASIC 480 (which can comprise dedicated preamplifiers 414, 424, 434 and 444, ADC 460, summation node 450, charge pumps 462, 472, 482, 492, and summation node 454). It is noted that one or more of charge pumps 462, 472, 482 and 492 can generate a negative voltage and one or more other charge pumps of charge pumps 462, 472, 482 and 492 can generate a positive voltage. Alternatively, one or more of charge pumps 462, 472, 482 and 492 that generate a negative voltage may be replaced with an inverter. In a differential embodiment, charge pumps 462 and 472 may generate negative voltages and charge pumps 482 and 492 may generate positive voltages. Alternatively, acoustic sensors 404 and 406 may share a single a single charge pump generating a positive voltage and acoustic sensors 408 and 446 may share a single charge pump (or inverter) generating a negative voltage. It is noted that acoustic sensors 404, 406, 408 and 446 can comprise one or more sensing elements. Such sensing elements can include membranes, diaphragms, or other elements capable of sensing and/or generating pulse signals. Summation node 450 can sum signals from acoustic sensors 404 and 406. Likewise, summation node 454 can sum signals from acoustic sensors 408 and 446. ADC 460 can subtract signals from summation node 450 and summation node 454 (e.g., subtract a signal of summation node 454 from a signal of summation node 450).

It is appreciated that a different number of charge pumps and/or inverters can be utilized by system 400. For example, a single charge pump can be utilized with inverters (e.g., similar to FIG. 2). In another example, each MEMS acoustic sensors 404, 406, 408 and 446 can be associated with different charge pumps. Moreover, pairs of MEMS acoustic sensors 404, 406, 408 and 446 can be associated with a charge pump and an inverter. For instance, MEMS acoustic sensors 404 and 408 can be coupled to a charge pump, wherein an inverter is disposed between the charge pump and MEMS acoustic sensors 408. Further, MEMS acoustic sensors 406 and 446 can be coupled to a charge pump, wherein an inverter is disposed between the charge pump and MEMS acoustic sensors 446. It is noted that system 400 can utilize a differential sensing scheme as described herein.

Similar to the systems described above, the sensitivity of acoustic sensors 404, 406, 408 and 446, their DC bias, the gain of preamplifiers 414, 424, 434 and 444, their noise and non-linearity are chosen in order to increase immunity to supply noise and interference, to increase the maximum tolerable sound pressure level, to improve linearity and signal-to-noise ratio of the overall system 400. In at least one embodiment, the signal path between positive and negative inputs of ADC 460 is kept substantially symmetric to achieve noise and interference immunity. One or more of preamplifiers 414, 424, 434 and 444, may have a variable gain set independent of or dependent on each other. Gains of preamplifiers 414, 424, 434 and 444 may be changed according to a certain AGC algorithm by means of an AGC component (e.g., an analog circuit or a digital processor).

Figure 5:
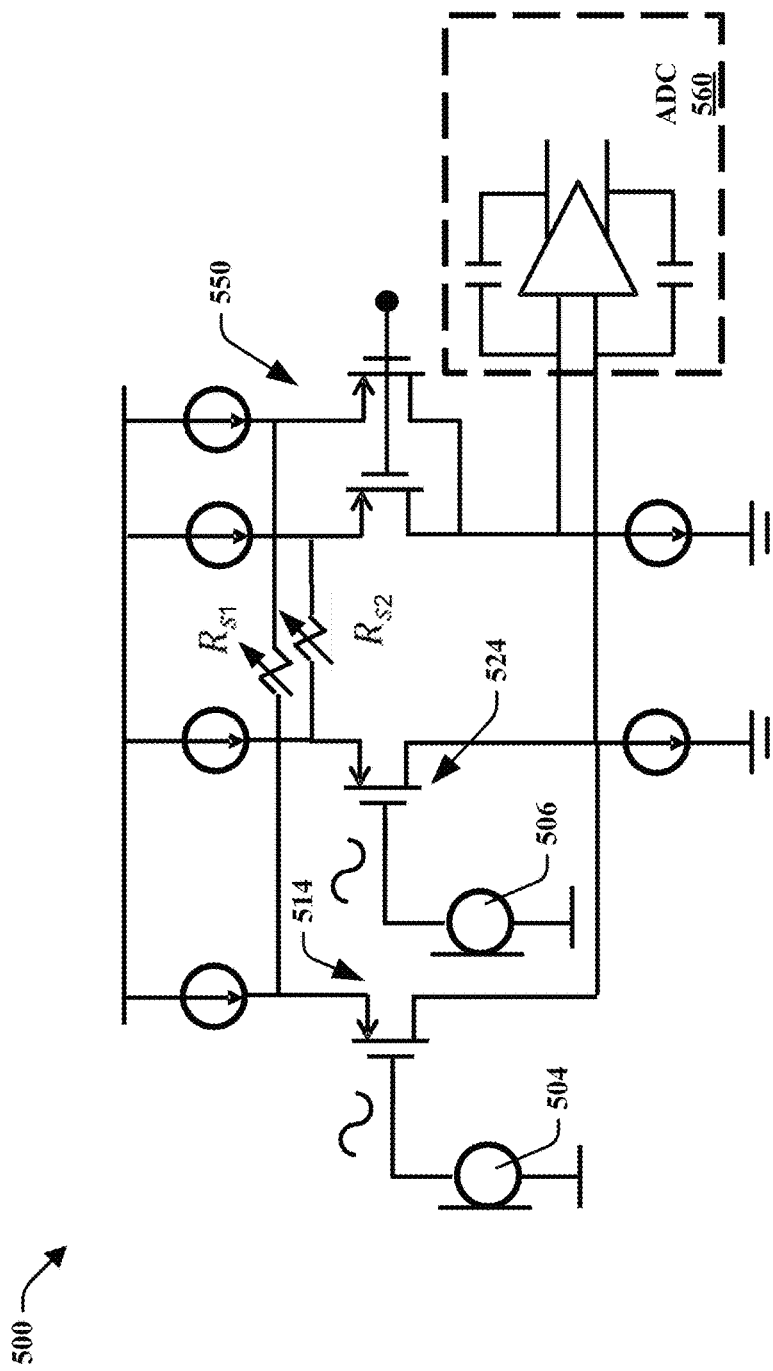
FIG. 5 depicts a non-limiting circuit diagram of an exemplary MEMS acoustic sensor system comprising dedicated preamplifiers, according to various non-limiting aspects of the subject disclosure.

Turning now to FIG. 5, there depicted is a non-limiting example circuit diagram of system 500 with dedicated amplifiers in accordance with various embodiments described herein. While, system 500 is depicted as comprising a number of components, it is noted that system 500 can comprise various other components (not shown). Furthermore, while components are depicted as separate components, it is further noted that the various components can be comprised in one or more components. It is to be appreciated that system 500 can comprise various other configurations in accordance with aspects disclosed herein.

As depicted, system 500 can primarily comprise MEMS acoustic sensors 504 and 506, preamplifiers 514 and 524, summation node 550, and ADC 560. It is noted that like named components can comprise similar functionality as components of various systems described herein (e.g., system 100, system 200, etc.). In an aspect, system 500 can be a circuit diagram representation of system 100. As depicted, MEMS acoustic sensor 504 can be associated with dedicated preamplifier 514 and MEMS acoustic sensor 506 can be associated with dedicated preamplifier 524. It is noted that dedicated preamplifier 514/524 can be disposed between MEMS acoustic sensor 504/506 and summation node 550 and/or ADC 560. In such a configuration, the gain of preamplifier 514 (G1) can be changed by varying resistor Rs1 and the gain of amplifier 524 (G2) can be changed by varying resistor Rs2. Resistors Rs1 and Rs2 may have linear or non-linear characteristic depending on a desired configuration.

In embodiments, system 500 can comprise a different number of MEMS acoustic sensors, such as described with reference to FIG. 3. Furthermore, system 500 can include a different number of summation nodes, preamplifiers, and the like. In some embodiment, dedicated preamplifier 514/524 may comprise more than one stage of amplification. In such systems, the output of 550 may be fed into a second stage of amplification and the output of the second amplifier will be applied to ADC 560.

Figure 6:
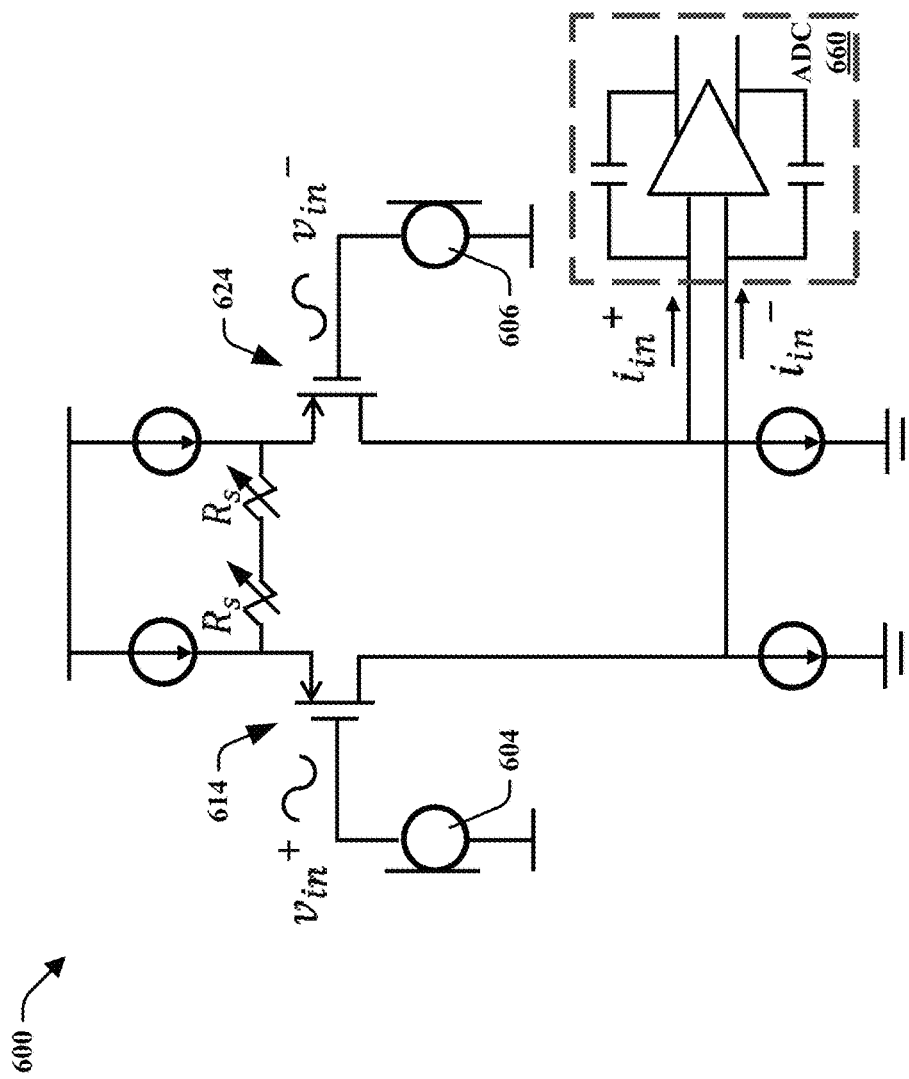
FIG. 6 depicts a non-limiting circuit diagram of an exemplary MEMS acoustic sensor system in a differential configuration and comprising dedicated preamplifiers, according to various non-limiting aspects of the subject disclosure.

Turning now to FIG. 6, there depicted is a non-limiting example circuit diagram of system 600 with dedicated amplifiers in a deferential configuration in accordance with various embodiments described herein. It is noted that system 600 is depicted as comprising a number of components, however system 600 can comprise various other components (not shown for readability). It is to be appreciated that system 600 can comprise various other configurations in accordance with aspects disclosed herein. Furthermore, while components are depicted as separate components, it is further noted that the various components can be comprised in one or more components. In embodiments, system 600 can comprise a different number of MEMS acoustic sensors, such as described with reference to FIG. 4. Furthermore, system 600 can include a different number of preamplifiers, charge pumps, and/or summation nodes, as described herein. While FIG. 6 depicts a fully-differential system, some embodiments may comprise a pseudo-differential system. In an aspect, system 600 can be a circuit diagram representation of system 200. As such, system 600 can comprise a MEMS acoustic sensing system in a differential configuration (e.g., at least one MEMS acoustic sensor is associated with a positive signal and at least one other MEMS acoustic sensor is associated with a negative signal.

As depicted, system 600 can primarily comprise MEMS acoustic sensors 604 and 606, preamplifiers 614 and 624, and ADC 660. It is noted that like named components can comprise similar functionality as components of various systems described herein (e.g., system 100, system 200, etc.). As depicted, MEMS acoustic sensor 604 can be associated with dedicated preamplifier 614 and MEMS acoustic sensor 606 can be associated with dedicated preamplifier 624. It is noted that dedicated preamplifier 614/624 can be disposed between MEMS acoustic sensor 604/606 and ADC 660.

In comparison with system 500, system 600 does not comprise a summation node, as depicted. In an aspect, the negative signal associated with MEMS acoustic sensor 606 can be subtracted from a positive signal from MEMS acoustic sensor 604, such as by ADC 660. In embodiments, ADC 560 can receive a single signal from summation node 550, while ADC 660 receives two or more signals. In another aspect, system 600 can comprise current type transistors and/or amplifiers. For example, system 600 can comprise current amplifiers, voltage amplifiers, transconductance amplifiers, and/or transresistance amplifier. It is noted that the type of amplifier can may result in alterations and/or different components than depicted in FIG. 6.

While several example embodiments are provided, it is noted that aspects of this disclosure are not limited to the exemplary embodiments. As such, the various embodiments disclosed herein can be applied to numerous applications. In exemplary embodiments, systems and methods described herein can be applied to smart phones, hand held gaming devices, hand held electronics, notebook computers, desktop computers, and the like. Such systems can utilize aspects disclosed herein to determine characteristics associated with acoustic signals, such as for speech recognition, pressure detection, or the like.

Figure 7:
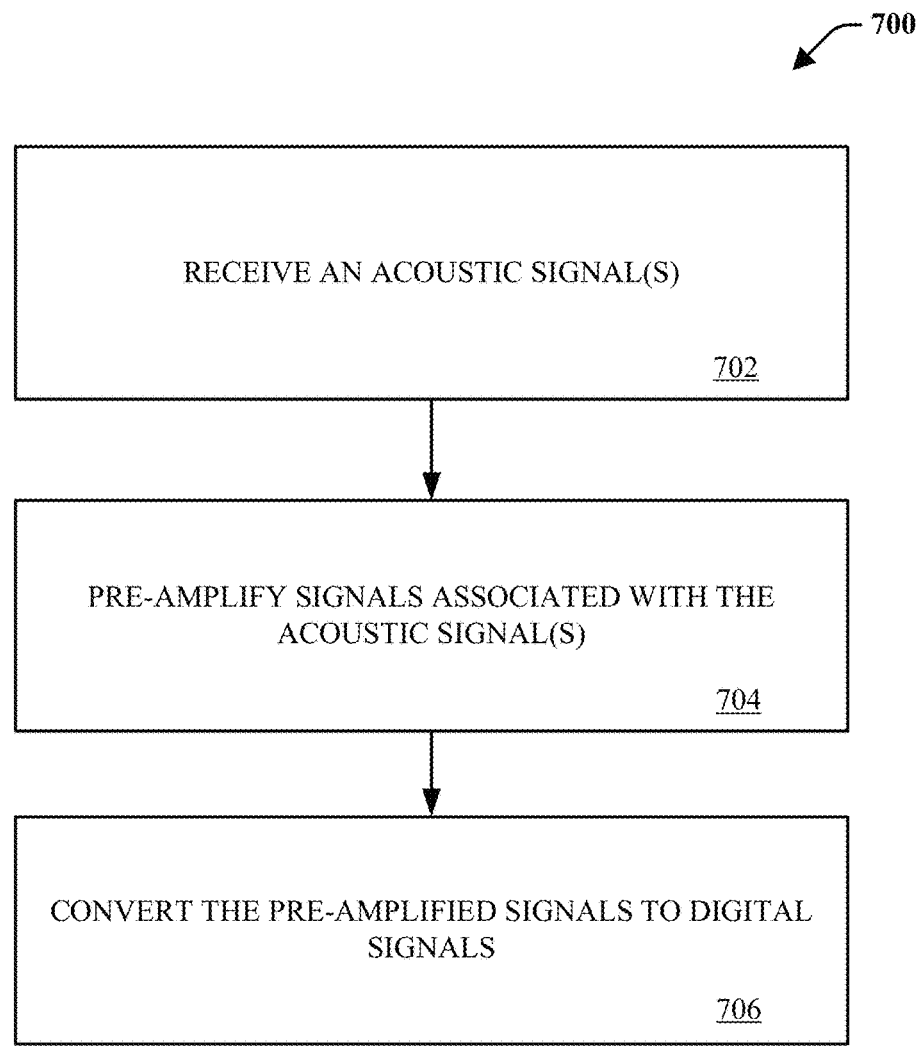
FIG. 7 depicts an exemplary flowchart of non-limiting methods associated with operation of a MEMS acoustic sensor comprising dedicated preamplifiers, according to various non-limiting aspects of the disclosed subject matter.
Figure 8:
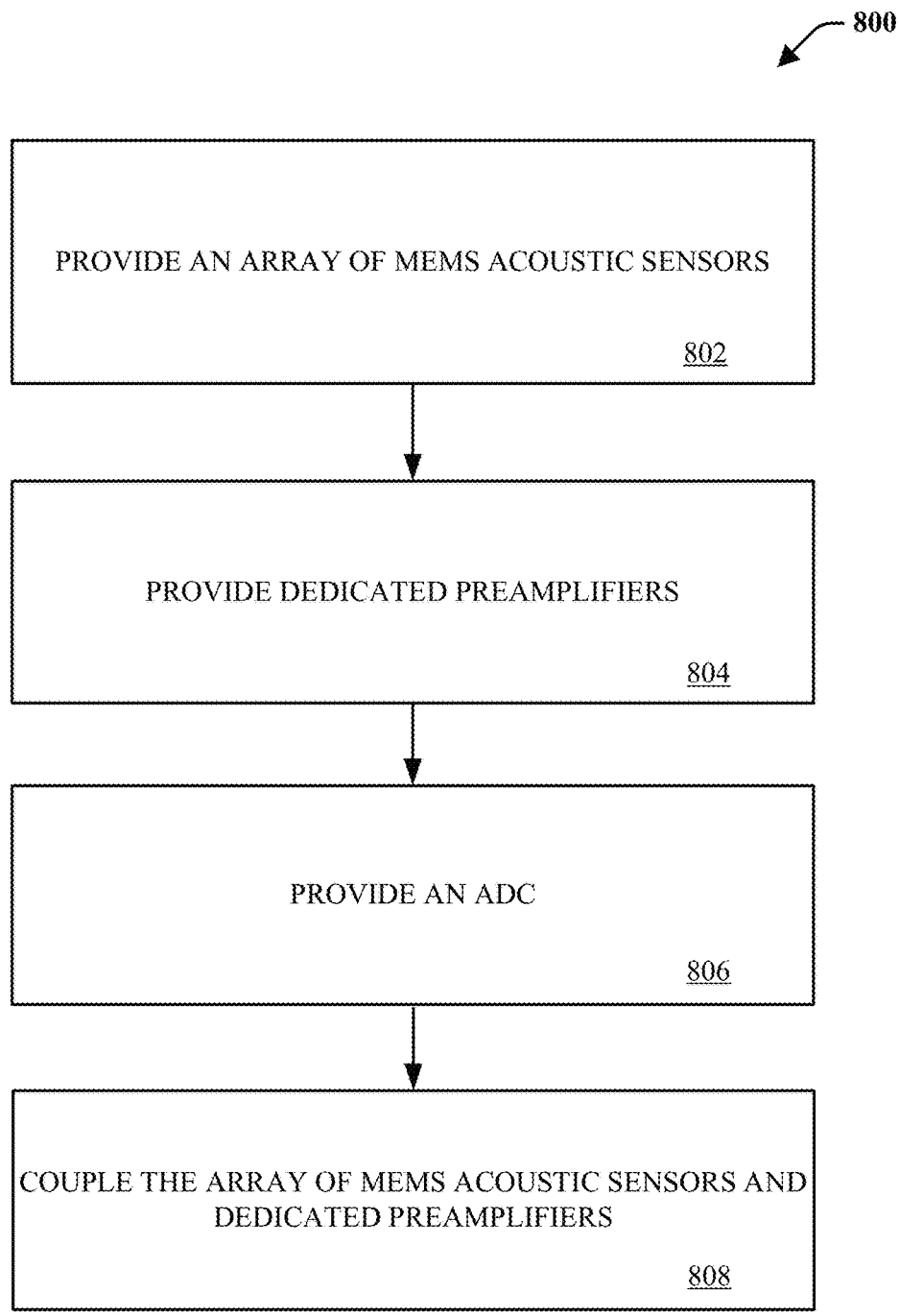
FIG. 8 depicts an exemplary flowchart of non-limiting methods associated with a MEMS acoustic sensor comprising dedicated preamplifiers, according to various non-limiting aspects of the disclosed subject matter.

In view of the subject matter described supra, methods that can be implemented in accordance with the subject disclosure will be better appreciated with reference to the flowcharts of FIGS. 7-8. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 7 depicts an exemplary flowchart of non-limiting method 700 associated with a MEMS acoustic sensor system with dedicated preamplifiers, according to various non-limiting aspects of the subject disclosure. As a non-limiting example, exemplary methods 700 can facilitate SNR reeducation associated with an ADC in a MEMS acoustic sensor system (e.g., system 100, 200, etc.).

At 702, a system (e.g., system 100, 200, etc.) can receive (e.g., via MEMS acoustic sensors 102, 104, etc.) an acoustic signal(s). Acoustic signals can be speech, pressure induced, or the like. For example, a user can speak into a cell phone comprising a MEMS acoustic sensor system.

At 704, the system can pre-amplify (e.g., via preamplifiers 114, 124, etc.) signals associated with the acoustic signal(s). Pre-amplifying can include amplification of a signal according to a certain gain, which may vary over time according to the characteristics of the signal, prior to conversion by an ADC (e.g., ADC 160). In an aspect, each received signal (e.g., via a MEMS acoustic sensor) can be separately pre-amplified by one or more preamplifiers. In another aspect, the gain of one or more preamplifiers may be changed dependently, independently, synchronously, asynchronously, continuously or in discrete steps according to a certain AGC algorithm or process.

At 706, the system can convert (e.g., via ADC 160) the pre-amplified signals to digital signals. For example, an ADC can receive signals from preamplifiers and/or a summation node(s). The signals can be converted (e.g., from analog to digital) by the ADC. In an aspect, an ADC can convert current and/or voltage signals.

FIG. 8 depicts an exemplary flowchart of non-limiting method 800 associated with a MEMS acoustic sensor system with dedicated preamplifiers, according to various non-limiting aspects of the subject disclosure. As a non-limiting example, exemplary methods 800 can provide for assembling, manufacturing, or otherwise providing a MEMS acoustic sensor system with dedicated preamplifiers.

At 802, an array of MEMS acoustic sensors can be provided (e.g., MEMS acoustic sensors 104, 106, etc.). In an aspect, the array of MEMS acoustic sensors can be disposed on a surface, such as a substrate. It is noted that the array of MEMS acoustic sensors can be provided within larger systems, such as a cellular phone or the like.

At 804, dedicated preamplifiers can be provided (e.g., preamplifiers 114, 124, etc.). It is appreciated that the dedicated preamplifiers can be provided within a device, on a surface or substrate, and the like. It is noted that the dedicated preamplifiers and the array of MEMS acoustic sensors can be disposed on the same or different surfaces. For instance, the dedicated preamplifiers can be disposed on an ASIC (e.g., ASIC 180). In another embodiment, an AGC component can alter or control the gain of one or more of the dedicated preamplifiers. For example, gain may be changed dependently, independently, synchronously, asynchronously, continuously or in discrete steps according to a desired AGC algorithm or process.

At 806, an ADC can be provided (e.g., summation node 150, ADC 160, etc.). In another aspect, a summation node can be provided according to various embodiments. In accordance with various embodiments described herein, the summation node and ADC can be comprised within an ASIC or other IC.

At 808, the array of MEMS acoustic sensors and dedicated preamplifiers can be coupled. In embodiments, each MEMS acoustic sensor of the array of acoustic sensors can be associated with one of more dedicated preamplifiers (e.g., as depicted in various figures herein). It is noted that coupling can include wirebonding, physically attaching (e.g., to the ASIC), chemical, mechanical, or other methods of bonding. In another aspect, the array of MEMS acoustic sensors can be attached and bonded to the ASIC.

The systems and processes described herein can be embodied within hardware, such as a single integrated circuit (IC) chip, multiple ICs, an ASIC, or the like. Further, the order in which some or all of the process blocks appear in each process should not be deemed limiting. Rather, it should be understood that some of the process blocks can be executed in a variety of orders, not all of which may be explicitly illustrated herein.

Figure 9:
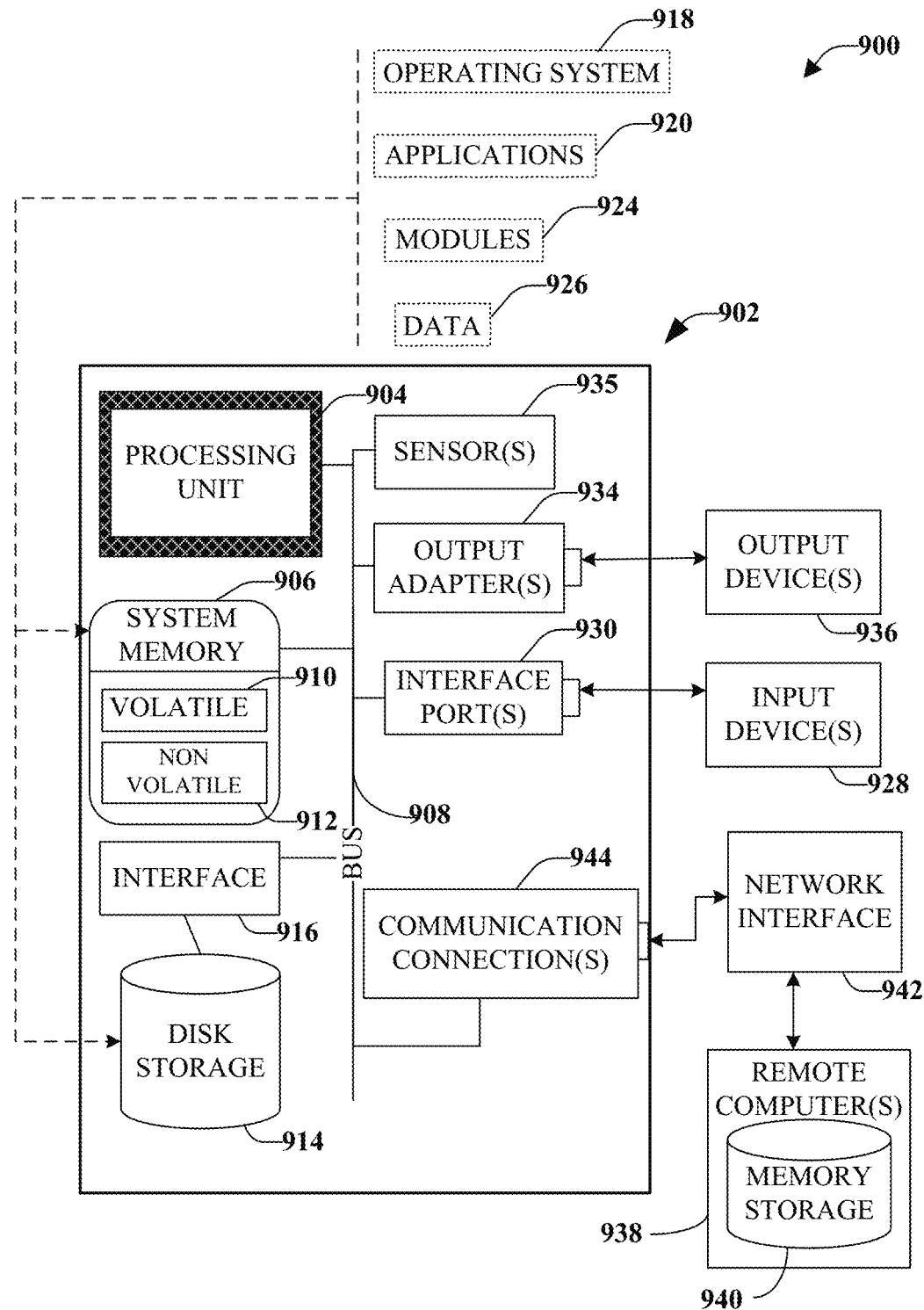
FIG. 9 depicts an example schematic block diagram for a computing environment in accordance with certain embodiments of this disclosure.

With reference to FIG. 9, a suitable environment 900 for implementing various aspects of the claimed subject matter includes a computer 902. The computer 902 includes a processing unit 904, a system memory 906, sensor(s) 935 (e.g., acoustic sensor(s), pressure sensor(s), temperature sensor(s), etc.), and a system bus 908. The system bus 908 couples system components including, but not limited to, the system memory 906 to the processing unit 904. The processing unit 904 can be any of various available processors. Dual microprocessors and other multiprocessor architectures also can be employed as the processing unit 904.

The system bus 908 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 906 includes volatile memory 910 and non-volatile memory 912. The basic input/output system (BIOS), containing the basic routines to transfer information between elements within the computer 902, such as during start-up, is stored in non-volatile memory 912. In addition, according to present innovations, sensor(s) 935 may include at least one audio sensor (e.g., MEMS microphone, etc.). Wherein the at least one audio sensor(s) may consist of hardware, software, or a combination of hardware and software. Although, sensor(S) 935 is depicted as a separate component, sensor(s) 935 may be at least partially contained within non-volatile memory 912. By way of illustration, and not limitation, non-volatile memory 912 can include read only memory (ROM), programmable ROM (PROM), electrically programmable ROM (EPROM), electrically erasable programmable ROM (EEPROM), or flash memory. Volatile memory 910 includes random access memory (RAM), which acts as external cache memory. According to present aspects, the volatile memory may store the write operation retry logic (not shown in FIG. 9) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 902 may also include removable/non-removable, volatile/non-volatile computer storage medium. FIG. 9 illustrates, for example, disk storage 914. Disk storage 914 includes, but is not limited to, devices like a magnetic disk drive, solid state disk (SSD) floppy disk drive, tape drive, Jaz drive, Zip drive, LS-100 drive, flash memory card, or memory stick. In addition, disk storage 914 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 914 to the system bus 908, a removable or non-removable interface is typically used, such as interface 916. It is appreciated that storage devices 914 can store information related to a user. Such information might be stored at or provided to a server or to an application running on a user device. In one embodiment, the user can be notified (e.g., by way of output device(s) 936) of the types of information that are stored to disk storage 914 and/or transmitted to the server or application. The user can be provided the opportunity to control having such information collected and/or shared with the server or application by way of input from input device(s) 928).

It is to be appreciated that FIG. 9 describes software that acts as an intermediary between users and the basic computer resources described in the suitable operating environment 900. Such software includes an operating system 918. Operating system 918, which can be stored on disk storage 914, acts to control and allocate resources of the computer system 902. Applications 920 take advantage of the management of resources by operating system 918 through program modules 924, and program data 926, such as the boot/shutdown transaction table and the like, stored either in system memory 906 or on disk storage 914. It is to be appreciated that the claimed subject matter can be implemented with various operating systems or combinations of operating systems.

A user enters commands or information into the computer 902 through input device(s) 928. Input devices 928 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 904 through the system bus 908 via interface port(s) 930. Interface port(s) 930 include, for example, a serial port, a parallel port, a game port, and a universal serial bus (USB). Output device(s) 936 use some of the same type of ports as input device(s) 928. Thus, for example, a USB port may be used to provide input to computer 902 and to output information from computer 902 to an output device 936. Output adapter 934 is provided to illustrate that there are some output devices 936 like monitors, speakers, and printers, among other output devices 936, which require special adapters. The output adapters 934 include, by way of illustration and not limitation, video and sound cards that provide a means of connection between the output device 936 and the system bus 908. It should be noted that other devices and/or systems of devices provide both input and output capabilities such as remote computer(s) 938.

Computer 902 can operate in a networked environment using logical connections to one or more remote computers, such as remote computer(s) 938. The remote computer(s) 938 can be a personal computer, a server, a router, a network PC, a workstation, a microprocessor based appliance, a peer device, a smart phone, a tablet, or other network node, and typically includes many of the elements described relative to computer 902. For purposes of brevity, only a memory storage device 940 is illustrated with remote computer(s) 938. Remote computer(s) 938 is logically connected to computer 902 through a network interface 942 and then connected via communication connection(s) 944. Network interface 942 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 944 refers to the hardware/software employed to connect the network interface 942 to the bus 908. While communication connection 944 is shown for illustrative clarity inside computer 902, it can also be external to computer 902. The hardware/software necessary for connection to the network interface 942 includes, for exemplary purposes only, internal and external technologies such as, modems including regular telephone grade modems, cable modems and DSL modems, ISDN adapters, and wired and wireless Ethernet cards, hubs, and routers.

Figure 10:
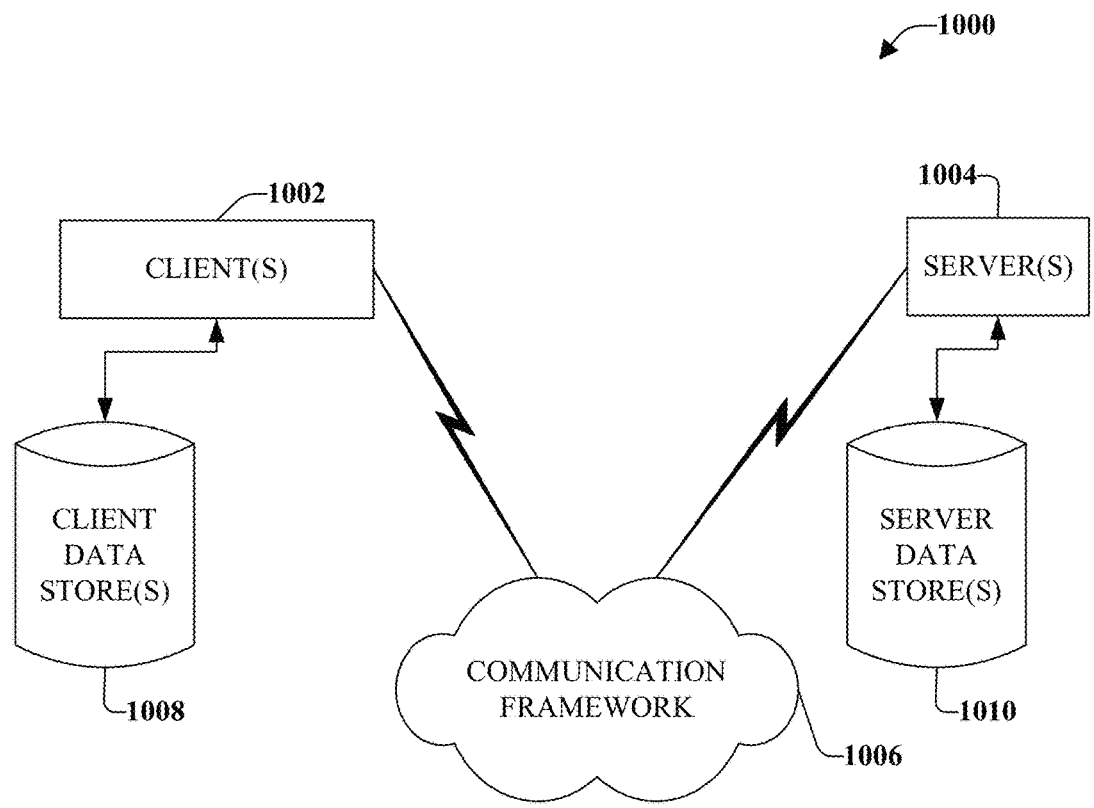
FIG. 10 depicts an example block diagram of a computer network operable to execute certain embodiments of this disclosure.

Referring now to FIG. 10, there is illustrated a schematic block diagram of a computing environment 1000 in accordance with this specification. The system 1000 includes one or more client(s) 1002 that may comprise a proximity sensing system according to various embodiments disclosed herein (e.g., laptops, smart phones, PDAs, media players, computers, portable electronic devices, tablets, and the like). The client(s) 1002 can be hardware and/or software (e.g., threads, processes, computing devices). The system 1000 also includes one or more server(s) 1004. The server(s) 1004 can also be hardware or hardware in combination with software (e.g., threads, processes, computing devices). The servers 1004 can house threads to perform transformations by employing aspects of this disclosure, for example. One possible communication between a client 1002 and a server 1004 can be in the form of a data packet transmitted between two or more computer processes wherein the data packet may include sensor data, proximity data, user defined rules, and the like. The data packet can include a cookie and/or associated contextual information, for example. The system 1000 includes a communication framework 1006 (e.g., a global communication network such as the Internet, or mobile network(s)) that can be employed to facilitate communications between the client(s) 1002 and the server(s) 1004.

Communications can be facilitated via a wired (including optical fiber) and/or wireless technology. The client(s) 1002 are operatively connected to one or more client data store(s) 1008 that can be employed to store information local to the client(s) 1002 (e.g., cookie(s) and/or associated contextual information). Similarly, the server(s) 1004 are operatively connected to one or more server data store(s) 1010 that can be employed to store information local to the servers 1004.

In one embodiment, a client 1002 can transfer an encoded file, in accordance with the disclosed subject matter, to server 1004. Server 1004 can store the file, decode the file, or transmit the file to another client 1002. It is to be appreciated, that a client 1002 can also transfer uncompressed file to a server 1004 and server 1004 can compress the file in accordance with the disclosed subject matter. Likewise, server 1004 can encode information and transmit the information via communication framework 1006 to one or more clients 1002.

The illustrated aspects of the disclosure may also be practiced in distributed computing environments where certain tasks are performed by remote processing devices that are linked through a communications network. In a distributed computing environment, program modules can be located in both local and remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more integrated circuit (IC) chips. For example, in one embodiment, a set of components can be implemented in a single IC chip. In other embodiments, one or more of respective components are fabricated or implemented on separate IC chips.

What has been described above includes examples of the embodiments of the present disclosure. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize. Moreover, use of the term "an embodiment" or "one embodiment" throughout is not intended to mean the same embodiment unless specifically described as such.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned systems/circuits/modules have been described with respect to interaction between several components/blocks. It can be appreciated that such systems/circuits and components/blocks can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer readable medium; or a combination thereof.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Computing devices typically include a variety of media, which can include computer-readable storage media and/or communications media, in which these two terms are used herein differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal that can be transitory such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

What is claimed is:

1. A system comprising:
an array of microelectromechanical systems (MEMS) acoustic sensors having identical mechanical structures and are employable to sense a common range of frequencies, wherein each MEMS acoustic sensor comprising a sensing membrane and wherein a first signal generated by a first MEMS acoustic sensor of the array is out of phase from a second signal generated by a second MEMS acoustic sensor of the array;
a charge pump that is directly coupled to the first MEMS acoustic sensor and is coupled to the second MEMS acoustic sensor via an inverter, wherein the charge pump generates a bias voltage that is provided to the first MEMS acoustic sensor and wherein an inverted version of the bias voltage is provided to the second MEMS acoustic sensor;
an array of preamplifiers, each preamplifier coupled to the respective sensing membranes of the array of MEMS acoustic sensors, each of the array of preamplifiers generating a respective output; and
an analog to digital converter (ADC) coupled to the array of preamplifiers and configured for generating an output based on the respective outputs of each of the array of preamplifiers.

2. The system of claim 1, further comprising:
a summation node configured for summing a first output from a first preamplifiers of the array preamplifiers and a second output of a second preamplifier of the array preamplifiers to generate a third output received by the ADC.

3. The system of claim 2, wherein the summation node further comprises a transconductor amplifier that sums current associate with the first output and current associated with the second output to generate the third output.

4. The system of claim 1, wherein a first preamplifier of the array preamplifiers is associated with the first MEMS acoustic sensor, and a second preamplifier of the array preamplifiers is associated with the second MEMS acoustic sensor of the array of MEMS acoustic sensor of the array, and wherein the charge pump generates a signal received by the second preamplifier.

5. The system of claim 4, further comprising:
wherein the ADC receives a first output from the first preamplifier and a second output from the second preamplifier and generates a third output as a function of the first output and the second output.

6. The system of claim 1, wherein the array of MEMS acoustic sensors comprises at least four sensing membranes and the array of preamplifiers comprises at least four preamplifiers respectively dedicated to the at least four sensing membranes.

7. The system of claim 1, further comprising application specific integrated circuit (ASIC) comprising the array of preamplifiers.

8. The system of claim 7, where the array of MEMS acoustic sensors are wirebonded to the ASIC.

9. The system of claim 7, where the array of MEMS acoustic sensors are bonded and attached to the ASIC.

10. The system of claim 1, further comprising:
an automatic gain control component coupled to one or more preamplifiers of the array of preamplifiers and configured to alter gains of the one or more of preamplifiers based on an automatic gain control process.

11. A device comprising:
a first microelectromechanical systems (MEMS) acoustic membrane coupled to a first preamplifier;
a second MEMS acoustic membrane coupled to a second preamplifier, wherein a first mechanical structure of the first MEMS acoustic membrane and a second mechanical structure of the second MEMS acoustic membrane are identical, wherein the first MEMS acoustic membrane and the second MEMS acoustic membrane are tuned to sense a common set of frequencies, wherein a bias voltage is provided to the first MEMS acoustic membrane and an inverted version of the bias voltage is provided to the second MEMS acoustic membrane, and wherein the first MEMS acoustic membrane generates a first signal that is out of phase with a second signal generated by the second MEMS acoustic membrane and wherein the first preamplifier generates a first output and the second preamplifier generates a second output;
a first summation node coupled to the first preamplifier and the second preamplifier, wherein the first summation node is configured to sum the first output and the second output to generate a third output; and
an analog to digital converter (ADC) coupled to the first summation node that receives the third output.

12. The device of claim 11, further comprising:
a third MEMS acoustic membrane coupled to a third preamplifier; and
a fourth MEMS acoustic membrane coupled to a fourth preamplifier, wherein the third preamplifier generates a fourth output as an inverted signal and the fourth preamplifier generates a fifth output as an inverted signal.

13. The device of claim 12, further comprising:
a second summation node coupled to the third preamplifier and the fourth preamplifier, wherein the second summation node is configured to sum the fourth output and the fifth output to generate a sixth output.

14. The device of claim 13, wherein the ADC is further coupled to the second summation node and receives the sixth output and subtracts the sixth output from the third output.

15. The device of claim 12, further comprising a charge pump coupled to the first preamplifier, the second preamplifier, the third preamplifier and the fourth preamplifier, the charge pump generating a positive signal followed by a inverter.

16. The device of claim 12, further comprising a first charge pump generating a positive voltage and a second generating a negative voltage, wherein the first charge pump is coupled to the first and second MEMS acoustic membranes and the second charge pump is coupled to the third and fourth MEMS acoustic membranes.

17. The device of claim 12, further comprising a first charge pump generating positive voltage and a second and a third charge pump each generating negative voltages, wherein the first charge pump is coupled to the first and second MEMS acoustic membranes, the second charge pump is coupled to the third MEMS acoustic membrane, and the third charge pump is coupled to the fourth MEMS acoustic membrane.

18. The device of claim 11, further comprising:
a processor coupled to the ADC and configured for determining acoustic characteristics associated with the first MEMS acoustic membrane and the second MEMS acoustic membrane.

19. A device comprising:
a first microelectromechanical systems (MEMS) acoustic membrane coupled to a first preamplifier;
a second MEMS acoustic membrane coupled to a second preamplifier, wherein a first mechanical structure of the first MEMS acoustic membrane and a second mechanical structure of the second MEMS acoustic membrane are the same, wherein the first MEMS acoustic membrane and the second MEMS acoustic membrane are to be employed to sense a common set of frequencies, wherein the first preamplifier generates a positive output and the second preamplifier generates a negative output, and wherein generation of the positive output and the negative output is a function of a first bias voltage being provided to the first MEMS acoustic membrane and a second bias voltage being provided to the second MEMS acoustic membrane, wherein the first bias voltage is an inverted version of the second bias voltage; and
an analog to digital converter (ADC) coupled to the first and second MEMS acoustic membranes and configured to subtract the negative output from the positive output to generate an analog subtracted signal and convert the analog subtracted signal to a digital subtracted signal.

* * * * *